United States Patent [19]
Baatz

[11] Patent Number: 5,578,918
[45] Date of Patent: Nov. 26, 1996

[54] MODULAR TWO OR THREE COIL MOVEMENT HAVING A MAGNET HOMING FREE CROSS SECTIONAL SHAPE OF THE SHIELD POT

[75] Inventor: Wilfried Baatz, Seattle, Wash.

[73] Assignee: Floscan Instrument Company, Inc., Seattle, Wash.

[21] Appl. No.: 278,185

[22] Filed: Jul. 21, 1994

[51] Int. Cl.⁶ .................................. G01R 1/04; G01R 1/16
[52] U.S. Cl. ........................................ 324/146; 324/151 R
[58] Field of Search ........................... 324/143, 146, 324/151 R, 156, 166, 174; 73/861.13, 861.08; 361/660, 664

[56] References Cited

U.S. PATENT DOCUMENTS

| | | | |
|---|---|---|---|
| 1,918,940 | 7/1933 | Triplett . | |
| 2,040,060 | 5/1936 | Middleton | 171/95 |
| 2,507,801 | 5/1950 | Middleton et al. | 171/95 |
| 2,710,377 | 6/1955 | Pfeffer | 324/146 |
| 2,738,497 | 3/1956 | Harland et al. | 340/315 |
| 2,875,409 | 2/1959 | Lamb et al. | 324/147 |
| 2,875,411 | 2/1959 | Lamb | 324/151 |
| 3,074,016 | 1/1963 | Thomander | 324/147 |
| 3,671,861 | 6/1972 | Fleetman et al. | 324/146 |
| 3,753,107 | 8/1973 | Burgett et al. | 324/146 |
| 4,275,371 | 6/1981 | Vogel | 335/272 |
| 5,004,976 | 4/1991 | Markow et al. | 324/154 |
| 5,038,099 | 8/1991 | Markow et al. | 324/143 |
| 5,243,752 | 9/1993 | Moore et al. | 324/146 |

*Primary Examiner*—Sandra L. O'Shea
*Assistant Examiner*—Roger Phillips
*Attorney, Agent, or Firm*—Christensen O'Connor Johnson & Kindness PLLC

[57] ABSTRACT

A modular meter movement having two or more coil assemblies. One embodiment of the meter is modular and includes coil assemblies that are formed as separate parts and configured to be attached to a magnet housing that houses a rotatably mounted permanent magnet. The magnet housing includes a plurality of arms that can accept either two or three coil assemblies depending upon the embodiment. The coil assemblies are placed over the magnet housing such that the coil assemblies at least partially surround the magnet housing. The magnet housing and coil assemblies are placed within a shield pot formed from a magnetically susceptible material. In one embodiment, the shield pot is non-cylindrical and the axis of rotation of the permanent magnet is mounted off the central axis of the shield pot. The shield pot is shaped so that even though it is non-cylindrical, it does not induce a homing position in the resulting meter.

22 Claims, 10 Drawing Sheets

MODULAR TWO OR THREE COIL MOVEMENT HAVING A MAGNET HOMING FREE CROSS SECTIONAL SHAPE OF THE SHIELD POT

FIELD OF THE INVENTION

The present invention relates to analog meters, and more particularly to "moving magnet" or "air core" movements for controlling the movement of an indicator in an analog meter.

BACKGROUND OF THE INVENTION

Analog meters of the type having a circular dial including a scale on the periphery of the dial and a rotatable pointer located at the center of the dial are widely used throughout the world. Such meters are fairly inexpensive to manufacture and provide a clear and accurate indication of the measured information. In some applications, analog meters have been replaced by digital displays. However, digital displays are generally more expensive to manufacture and require a more sophisticated electronic processor than analog meters. Digital displays also do not allow a user to see the "rate of change" in readings at a glance.

Some analog meters use a "moving magnet" or "air core" movement to control the rotation of the indication. Such movements generally include a permanent magnet rotatably mounted on a shaft within two orthogonal electrical coils. Energizing the electrical coils produces a magnetic flux that interacts with the magnetic flux of the permanent magnet. Independently controlling the power supplied to each electrical coil shifts the resulting magnetic field, thus controlling the angular position of the permanent magnet.

Although air core movements have been available for many years, they still have a number of problems. Most air core movements use two overlapping, perpendicularly oriented electrical coils commonly referred to as "cross coils." Generally, cross coil meters include a permanent magnet mounted on a shaft that is rotatably mounted within a protective case or "bobbin." The two cross coils are formed by winding loops of wire over the exterior of the bobbin. The loops of the first or inner coil are wound around the bobbin such that half of the coil is located on each side of a centrally located shaft. The loops of the second or outer coil are wound over the top of and perpendicular to the first coil such that half of the second coil is located on each side of the shaft.

To ensure that the bobbin and shaft are not damaged or deformed, each loop of each coil should be alternately wound on one side of the shaft and then on the other side of the shaft. Alternate winding ensures that an even force is applied to both sides of the bobbin during winding. Failure to alternately place each loop of each coil at approximately the same tension often causes the case or "bobbin" to deform, bends the shaft, or induces inaccuracies in the meter as described below.

After completing winding loops of wire over the exterior of the bobbin to form the coils, the ends of the wire are generally soldered to electrical pole pieces embedded in the bobbin. In order to prevent the soldering operation from melting the structure of the bobbin, the bobbin is formed of a material that has a high heat deflection and can withstand the soldering temperatures. Unfortunately, materials that can withstand high temperatures and have good structural stability generally make poor bearing materials. Therefore, either separate bearings must be used between the shaft and bobbin or poor bearings may be formed integrally in the structure of the bobbin. Separate low friction bearings provide for more efficient and smoother movement of the shaft and pointer but may add additional cost to the meter. Integral bearings formed of a poor bearing material may reduce cost but also increase friction, thus reducing bearing efficiency. In order to overcome the increased friction, the meter must use larger coils capable of providing additional torque. Larger coils consume more power, produce more heat than smaller counterparts, and may increase the overall size of the meter.

The resistance and cross-sectional area enclosed by the coils in cross coil movements are mismatched because the outer coil is wound over the top of the inner coil. This results in the outer coil being composed of a longer length of wire and thus having greater resistance than the inner coil. Failure to wind both coils at the same tension or with the same number of loops also contributes to differences in length of the wire and thus resistance between coils. It is often necessary to add a resistor to one of the coils to balance the resistance between the coils. In addition, if the coils are not wound consistently from movement to movement, including the tension on each loop, the placement of the loops, and the number of loops in each coil, it is often necessary to individually calibrate and balance each movement. Such calibrations add a great deal of expense and complexity to the manufacturing process.

Cross coil movements are also sensitive to temperature variations. The resistance of the wire used to form the coils is a function of temperature. Because the outer coil is wound over the inner coil, there is often a temperature difference between the two coils when the movement is operating due to the heating of the coils when energized by an electrical current. The change in resistance caused by such temperature differences can throw the delicate balance of the coils off, thus contributing to meter inaccuracy.

Some of the problems with cross coil movements can be reduced by using a current driving circuit to energize the coils as opposed to a voltage driving circuit. A current driving circuit is capable of maintaining a constant current in each coil, thus eliminating the need to carefully balance the resistance of the coils. However, current driving circuits require more complex electronics and are more expensive to produce than voltage driving circuits.

The amount of torque produced by a cross coil movement for a given electrical power input is a function of the amount of copper contained within each coil and the strength and radius of the permanent magnet mounted on the shaft. Cross coil movements that produce reasonable amounts of torque over a reasonable range of movement are fairly large. The size of the cross coil movement is the major factor that prevents the size of analog instruments from being reduced. The size of the movement is especially important in meters which combine both analog and digital displays or in cluster instruments that use more than one meter movement. In such instruments, the analog movement must be as small as possible to leave room for the digital display device.

In addition to cross-coil movements, U.S. Pat. No. 5,004, 976, issued to Markow et al. discloses a three coil "Y" air core movement. In Markow et al., three coil assemblies are equal angularly spaced outwardly from and around a permanent magnetic that is rotatably mounted on a shaft. The individual coil assemblies are inserted into the top or bottom of pockets spaced at equal angles about a housing that surrounds and supports the permanent magnet. The coil assemblies are energized using a series of pulse width modulated signals at a chosen frequency and duration to angularly displace the permanent magnet.

The movement disclosed in Markow et al. reduces some of the problems associated with cross coil movement designs. Specifically, each coil assembly may contain equal numbers of turns of the same size and resistance wire. However, Markow et al. spaces the electrical coil on each coil assembly radially outward from the permanent magnet. The further the coils are spaced from the magnet, the greater the power input required to produce the same amount of torque. The meter of Markow et al. is also placed within a round shield pot that prevents nesting a plurality of meters to produce shorter distances between the centers of the shafts and thus indicators.

A number of applications including vehicles such as automobiles, motorcycles and commercial trucks would benefit greatly from reduced meter size and closer spacing between the centers of the shafts of the meters. Because of the importance of drivers to keep their eyes on the road, there is a limited field of vision available for often viewed important instrumentation. Reduced instrumentation size would allow more meters and thus information to be placed within the driver's field of vision.

It would be beneficial if smaller meter movements could be designed. It would also be beneficial if the movements could be placed within containers or shield pots that could be nested together to reduce the distance between the shafts of the meters. Currently, placing moving magnet meter movements off center within a round shield pot or placing meter movements within a non-circular shield pot results in the permanent magnet and thus pointer seeking a fixed homing position when the coils are not energized. This homing phenomenon is also present during operation of the coils. As the permanent magnet mounted within the shield pot rotates, it magnetizes the shield pot. The poles of the magnetic field produced in the shield pot lag the rotating magnetic field of the and permanent magnet influencing the movement of the permanent magnet, possibly causing hysteresis errors during operation of the meter.

A goal of the present invention is to reduce the problems associated with cross coil and other moving magnet movement designs. A further goal of the invention is to reduce the size of the meter movement while increasing or maintaining its efficiency and accuracy.

SUMMARY OF THE INVENTION

The invention is a two or three coil moving magnet movement for driving an indicator in a meter. The movement includes a magnet housing, a permanent magnet rotatably coupled to the housing for rotation about an axis of rotation, two or three coil assemblies, depending upon the embodiment, positioned around the axis of rotation and a shield pot formed of a magnetically susceptible material at least partially surrounding the coil assemblies and magnet housing. The coil assemblies are positioned around the axis of rotation of the permanent magnet and produce a magnetic flux response to an electrical signal in order to angularly displace the permanent magnet to a desired orientation.

In one embodiment of the invention, the first and second coil assemblies are formed as discrete parts separate from the magnet housing. The first and second coil assemblies include a bobbin formed of a material that has a high heat deflection temperature while the magnet housing is formed of a material that can function as a good bearing surface. In accordance with other features of the invention, a shield pot surrounding the movement may be non-cylindrical and does not result in the permanent magnet seeking a homing position. In accordance with other aspects of the invention, the coil assemblies at least partially overlap the housing and cylindrical surface defined by the circumference of the permanent magnet. The non-cylindrical shield pot includes two approximately flat sides that are joined at one end and at the other end are joined to a generally elliptical curved surface. The non-cylindrical shield pot allows two or more meter movements to be nested together to reduce the distance between the center of the axis of rotation of the permanent magnets over similar movements contained within a round shield pot.

The invention's use of discrete coil assemblies allows the resistance, size, location, number of loops, etc. of each coil assembly to be carefully matched. In particular, if an automated manufacturing process is used, each coil assembly can be maintained at a constant number of windings and wound at a constant pressure. This allows the coils of the present invention to be carefully matched in resistance thus reducing problems associated with cross coil movements. In addition, each coil assembly can be manufactured with the same thickness, thus absorbing and radiating heat at approximately the same rate. Therefore, as the drive mechanism is energized, the electrical coils of each coil assembly heat and cool more evenly, increasing the accuracy of the meter.

Another advantage of the present invention is that it is a modular design that utilizes the same parts to produce either a two coil assembly or a three coil assembly movement. In addition, the invention allows the magnet housing to be formed from a suitable bearing material while the bobbins of each coil assemblies are formed of a structurally stable, high temperature material capable of being solder dipped. The present invention does not need to compromise on either the bearing surfaces of the magnet housing or the structural rigidity and temperature capabilities of the coil assembly, thus producing a better performing movement.

The present invention may also be used to nest more than one meter together thus reducing the distance between the shafts of the meters which in turn reduces the size of an instrument cluster.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 8:
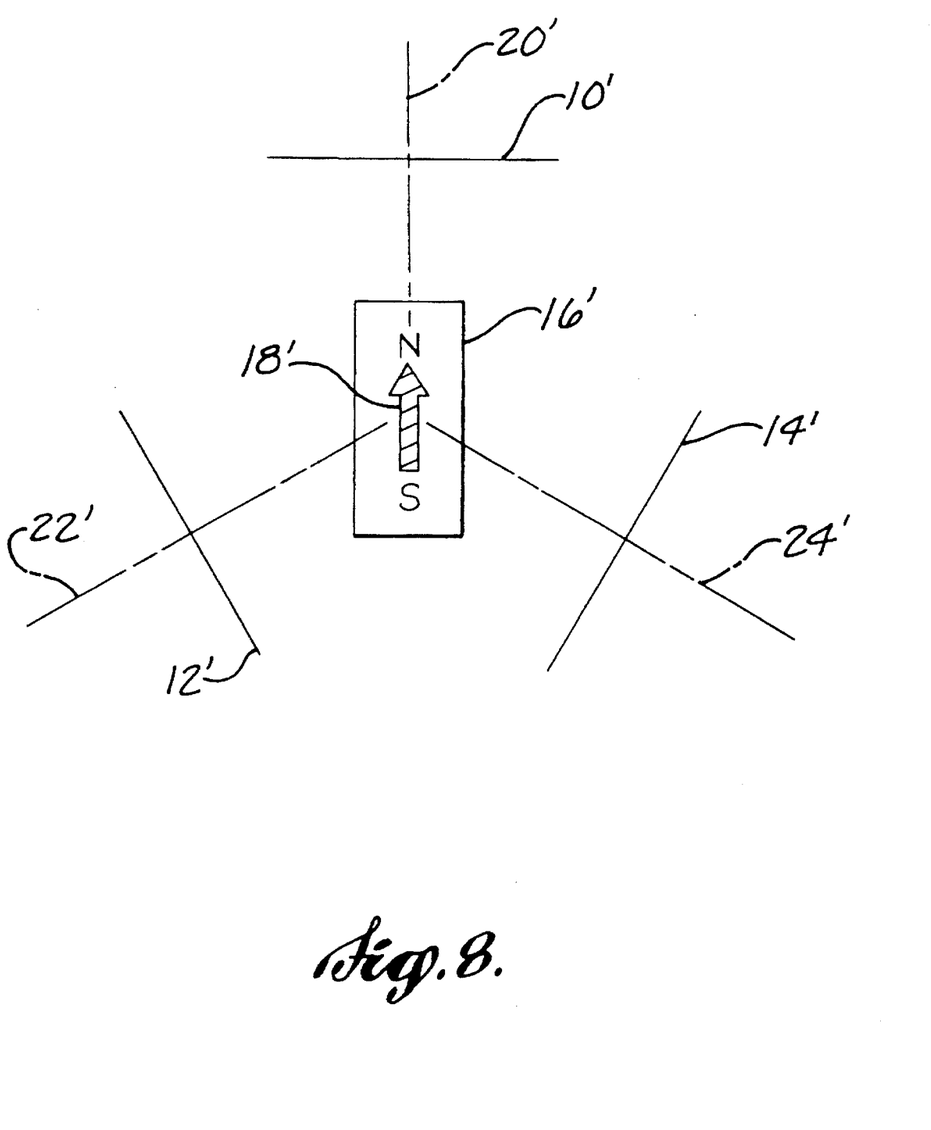
FIG. 8 is a schematic representation of a three coil movement.

Referring initially to FIG. 8, the general operating principal of the present invention is illustrated. The present invention is an analog meter movement that includes two or three coil assemblies 10', 12' and 14' depending upon the embodiment of the invention. In the two coil embodiment, one of the coil assemblies 10', 12' or 14' would not be used. The coil assemblies 10', 12' and 14' are oriented about a rotatably mounted permanent magnet 16' having diametrically opposite north "N" and south "S" poles. A pointer 18' is mounted on the magnet 16' and aligned with the axis formed by the N-S poles. Energizing the coil assemblies 10', 12' and 14' produces magnetic fields 20', 22' and 24' with North-South axes perpendicular to their respective coil assemblies. The magnetic fields 20', 22' and 24' produced by the coil assemblies interact with the magnetic field produced by the permanent magnet 16' causing the magnet to rotate. Selectively energizing the coil assemblies 10', 12' and 14' results in the North-South axes of the combined magnetic fields shifting, thus causing the permanent magnet 16' and pointer 18' to realign.

Referring now to FIGS. 1–5, a first embodiment of an analog meter movement 10 of the present invention is illustrated. The first embodiment includes two coil assemblies however, other embodiments could include three and some applications possibly more coil assemblies. Two coil assemblies are preferred in some applications to reduce the number of coil assemblies, thus reducing overall movement costs. In addition, the use of two coil assemblies as shown allows the invention to utilize a non-cylindrical shield pot that may be nested as described below.

Figure 1:
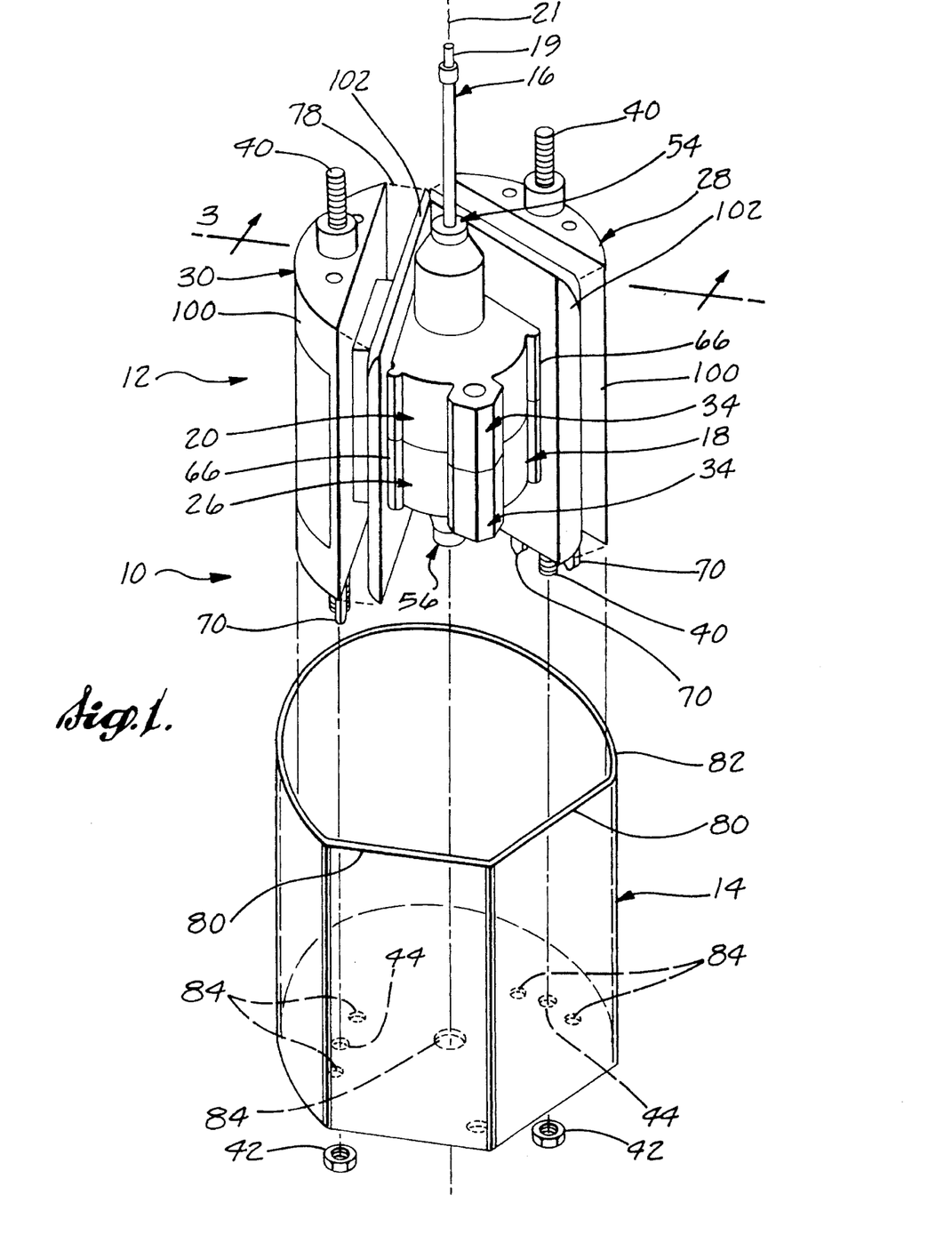
FIG. 1 is a partially exploded view of an analog meter movement according to the present invention.

The movement 10 includes a drive mechanism generally designated 12 that is housed within a container or shield pot 14. The drive mechanism 12 includes two coil assemblies 28 and 30 that are used to angularly displace a rotatably mounted shaft 16 that extends upward from the center of the drive mechanism. The shaft 16 has a splined proximal end 19 that is adapted to be coupled to the indicator or pointer (not shown) of an analog meter. Angular displacement of the shaft 16 causes a corresponding angular displacement of the meter's indicator.

Figure 2:
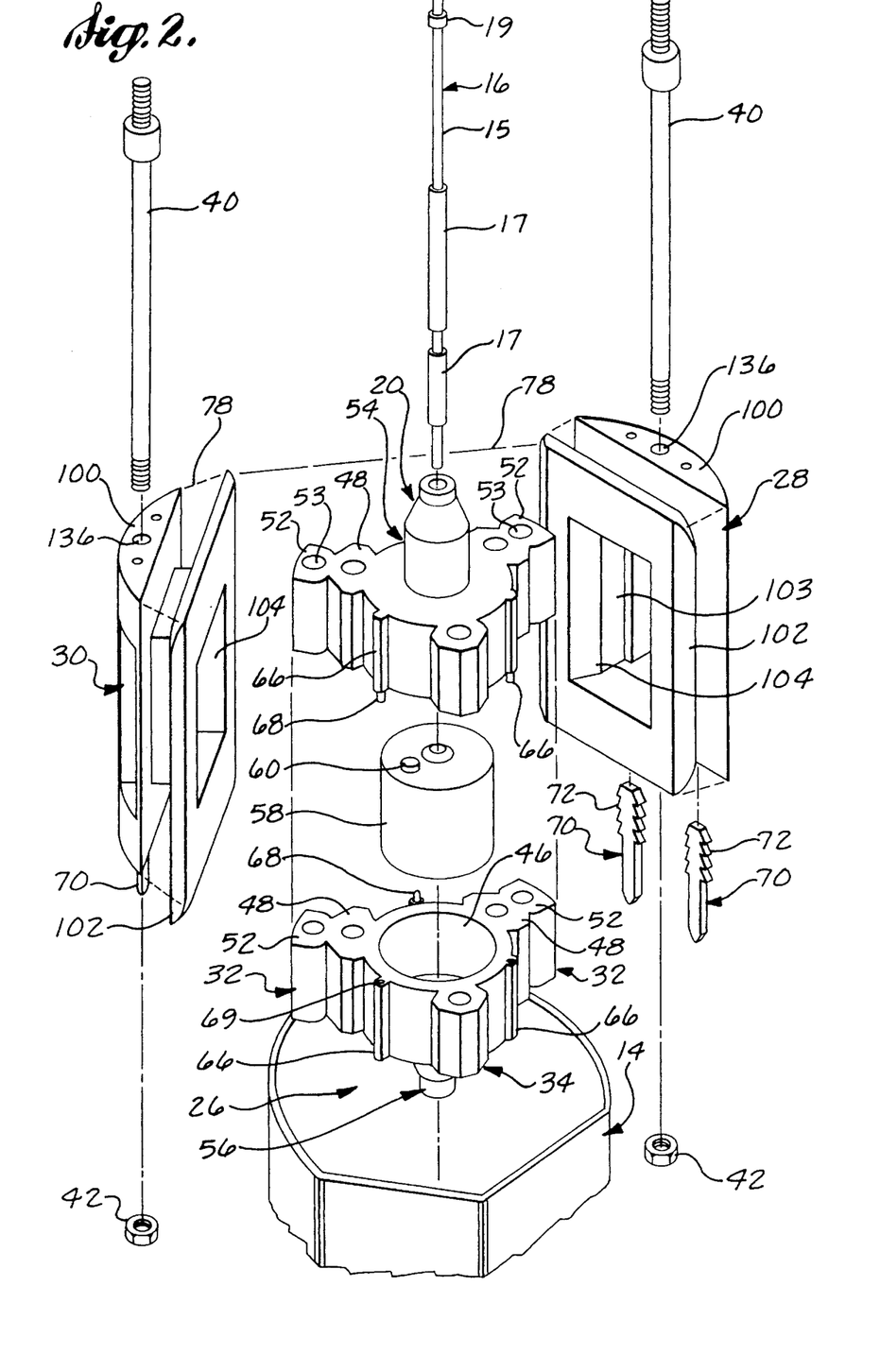
FIG. 2 is a fully exploded view of the analog meter movement of FIG. 1.
Figure 3:
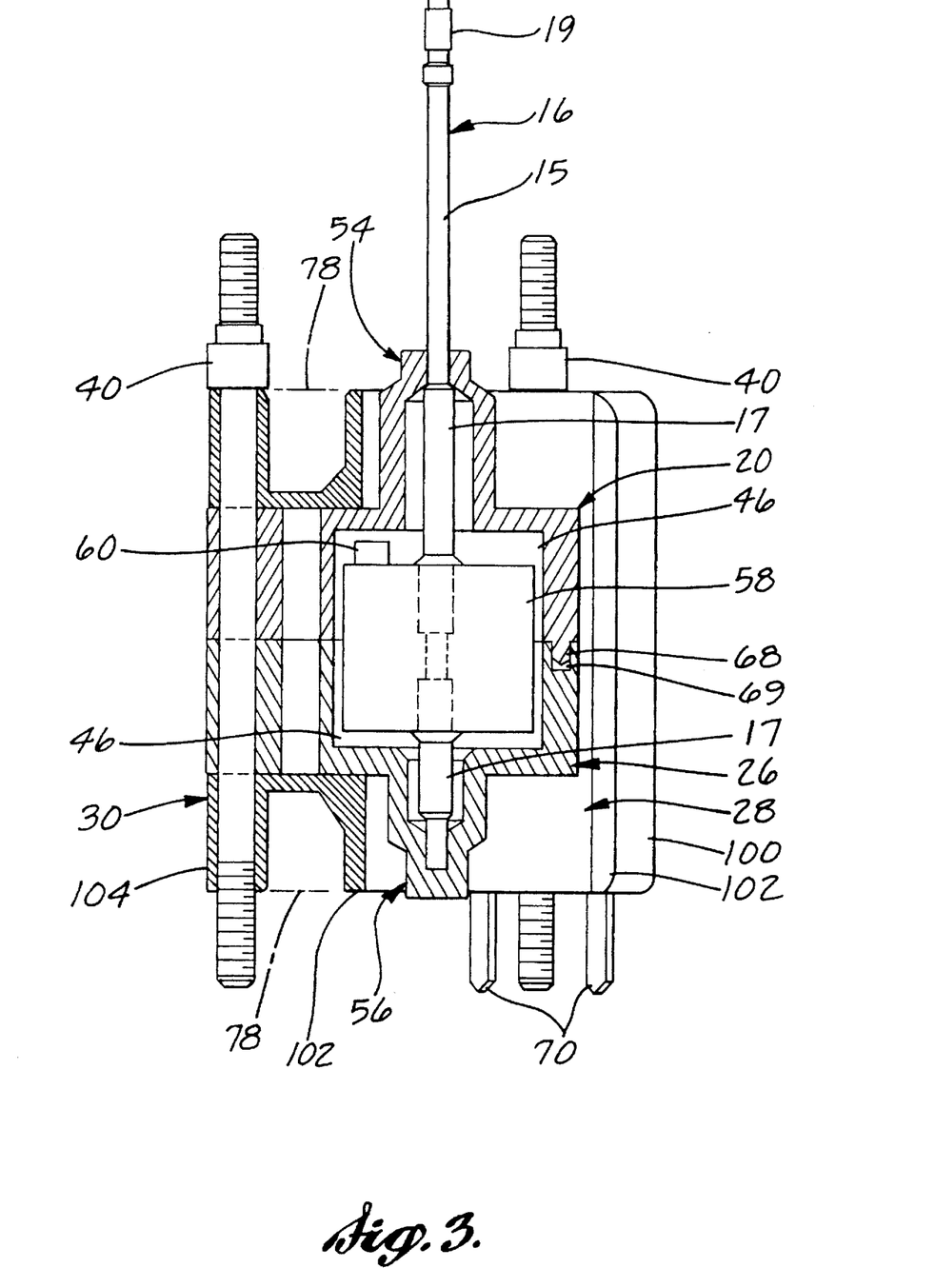
FIG. 3 is a partial cut away side elevational view of the movement of FIG. 1 along the plan shown in FIG. 1.

The shaft 16 is rotatably mounted within a two piece magnet housing 18 to rotate about an axis of rotation 21 (FIG. 1). As best seen in FIGS. 2 and 3, a cylindrical permanent magnet 58 is formed around a portion 17 of the shaft 16 and is contained within the interior of the housing 18. The two coil assemblies 28 and 30 are mounted on the exterior of the housing 18. The drive mechanism 12 including housing 18 and coil assemblies 28 and 30 is sized to be contained within the shield pot 14. Each coil assembly 28 and 30 include coils 78 (FIG. 2) formed of loops of conductive wire that may be electrically connected to a driving circuit (not shown) to produce magnetic fields that angularly displace the permanent magnet 58 and shaft 16 as described below.

The drive assembly 12 is attached to the shield pot 14 using two studs 40 (FIGS. 1 and 2). The studs 40 pass through the coil assemblies 28 and 30, through apertures 44 in shield pot 14 and are received within fasteners such as nuts 42 located adjacent the bottom surface of the shield pot. When the drive assembly 12 is placed within the shield pot 14, two electrical pole pieces 70 on each of the coil assemblies 28 and 30 also extend through corresponding apertures 84 in the bottom of the shield pot. The electrical pole pieces 70 are electrically attached to the coils 78 and are also electrically attached to an electrical driving circuit (not shown) used to drive the coils 78.

In alternate embodiments, the electrical pole pieces 70 could be located on the opposite end of the coil assemblies 28 so that they extend out the top of the shield pot. In the alternate embodiments, the drive assembly 12 could then be mounted to a circuit board located at the forward end of the shield pot through the use of the studs 40 or the electrical pole pieces 70.

As best illustrated in FIGS. 2 and 3, the magnet housing 18 is preferably formed as a two-part structure having an upper cover 20 and a lower cover 26. The upper and lower covers are aligned during assembly by alignment pins 68 that extend from the matching faces of the covers and are received in corresponding apertures 69. The magnet housing 18 is generally cylindrical in shape and includes three arms, two of which are generally labeled 32 and one 34, that extend radially outwardly from the circumference of the covers. In the preferred embodiment, the arms 32 and 34 are equally spaced around the rotational axis 21 of the shaft 16; however, in alternate embodiments, the arms could be spaced around the shaft at different angles. The two arms 32 extend radially outward farther than the third arm 34, and are used to mount the two coil assemblies 28 and 30 to the magnet housing 18. The third arm 34 is used to mount a third coil assembly to the bobbin 18 as described in the second embodiment of the invention discussed below.

Both the upper and lower covers 20 and 26 include cylindrical recesses that align with each other when the upper and lower covers are joined to form a single cylindrical cavity 46 (FIGS. 1 and 3) within the magnet housing. The magnet housing 18 also includes upper and lower bearing assemblies 54 and 56 respectively. The bearing assemblies 54 and 56 extend outward normal to the upper and lower surfaces, respectively, of the magnet housing 18. As best seen in FIG. 3, the shaft 16 is rotatably mounted within the magnet housing 18 such that the permanent magnet 58 may freely rotate within the cavity 46. The shaft is supported on both ends by the upper and lower bearings 54 and 56.

Preferably, the magnet housing 18 is formed of a material having a low coefficient of friction that is suitable for use as a bearing surface for the shaft 16. Forming the magnet housing from a suitable bearing material allows the bearings 54 and 56 to be formed as an integral part of the magnet housing 18, thus reducing manufacturing time, complexity and possibly cost. The lower bearing 56 is sized so that the lower end of the shaft 16 may ride within the bearing 56 while the wider portion 17 of the shaft is sized to remain outside of the bearing 56. Similarly, the upper bearing 54 is sized to allow the narrow portion 15 or spindle of the shaft to rotate within the bearing while trapping the wider portion 17 of the shaft within the magnet housing 18. Upward movement of the shaft 16 within the magnet housing 18 is prevented by the wider portion 17 of the shaft contacting the interior surface of the bearing 54. Downward movement of the shaft is limited by the lower portion of the shaft contacting the interior surface of the bearing 56.

One suitable material from which to form the magnet housing is Delrin™, however, other suitable bearing materials including Teflon®, nylon etc. may also be used.

In some embodiments of the invention, the permanent magnet 58 may include a protrusion 60 (FIG. 3) that extends upward from the upper surface of the magnet. The protrusion 60 is used in combination with protrusions (not shown) extending downward from the upper surface of the cavity 46 to limit the angular displacement of the shaft. In embodiments where the angular displacement of the shaft 16 is not limited, the protrusions (not shown) extending downward from the upper surface of the cavity 46 may be eliminated, thus allowing the shaft 16 to rotate a full 360°.

Figure 4:
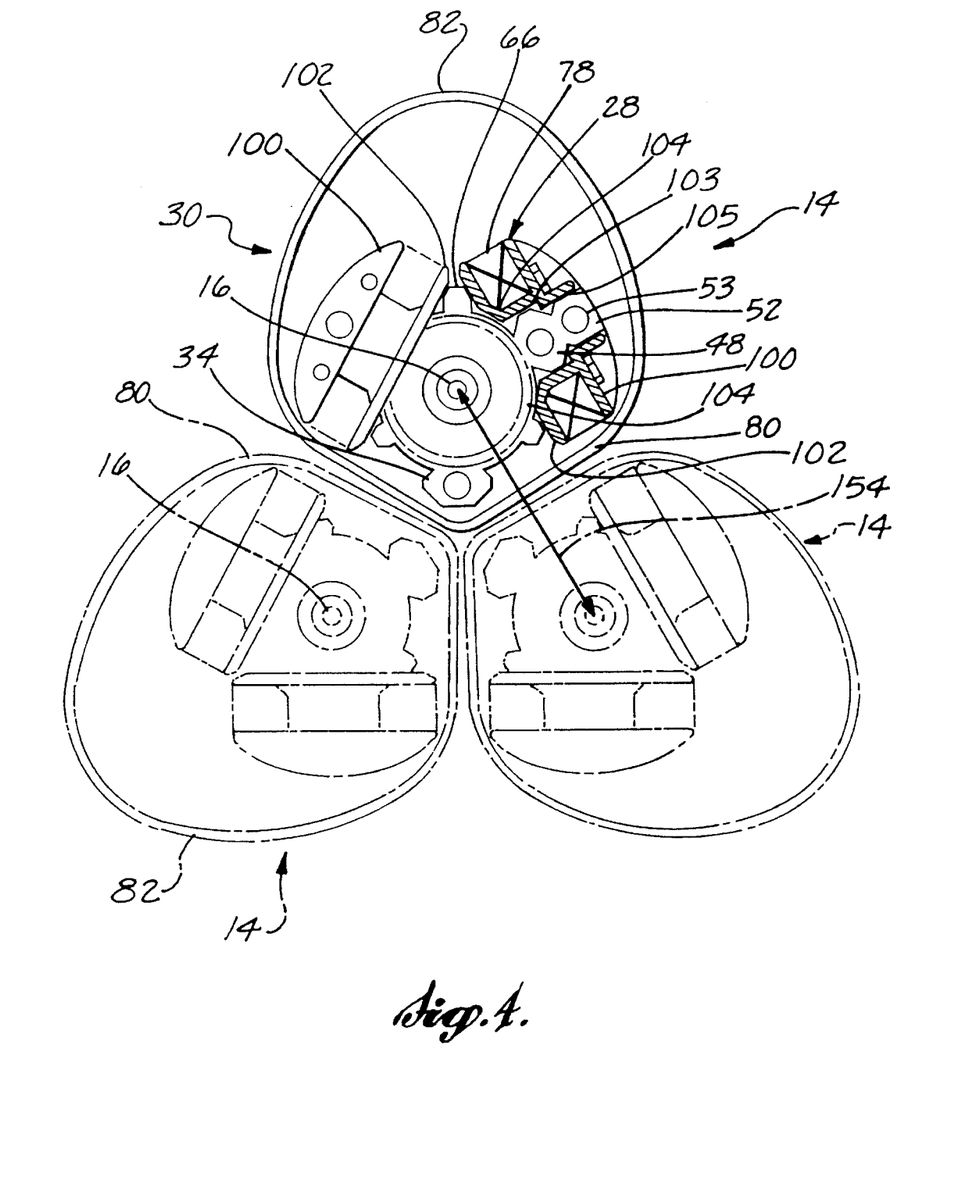
FIG. 4 is a top, partial cut away view of the movement of FIG. 1 shown nested along with two additional movements.
Figure 5:
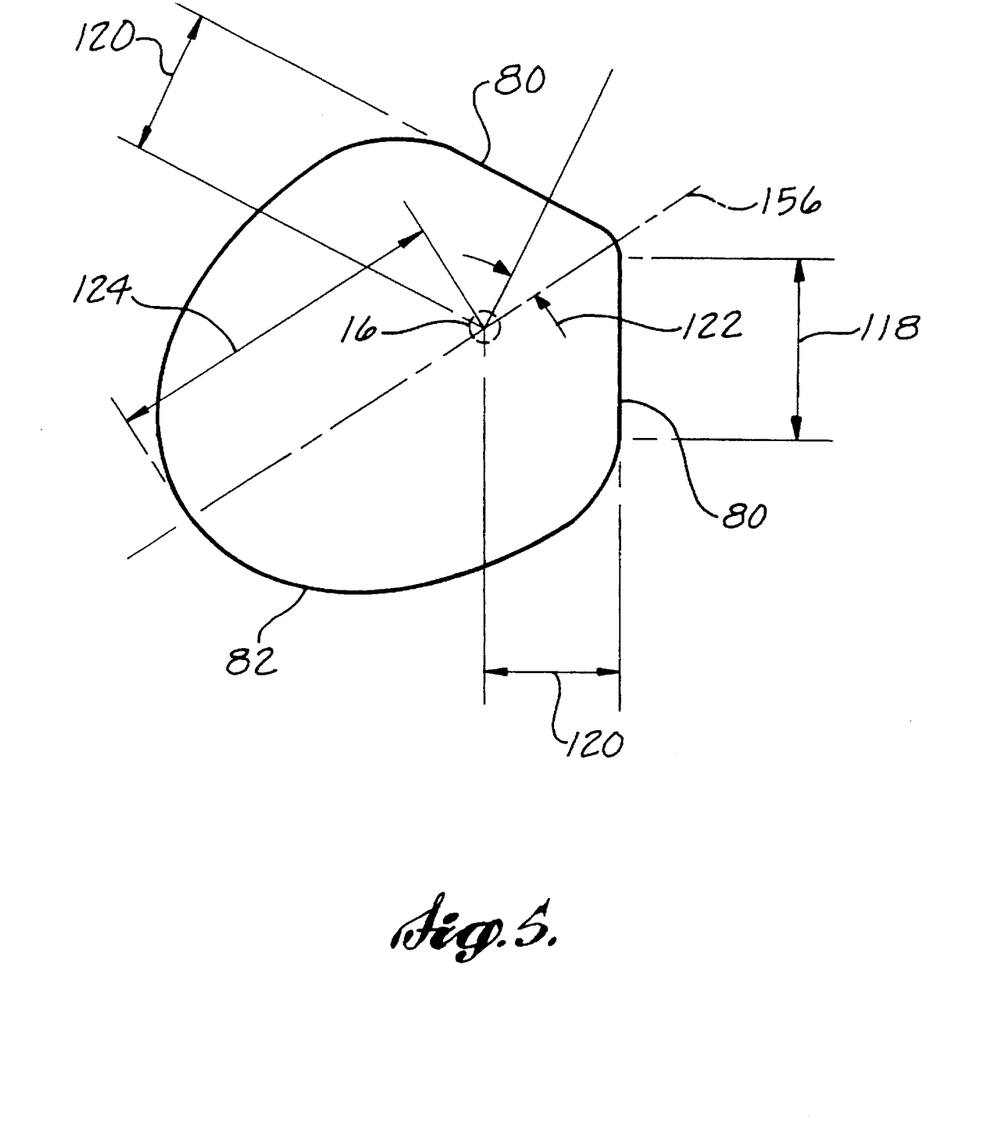
FIG. 5 is a top view of the shield pot of the movement of FIG. 1.

As best illustrated in FIGS. 2 and 4, the longer arms 32 include a coil assembly support section 48 located inward of a coil assembly attachment section 52. The width of the support section 48 is sized so that the exterior surfaces of the support section contact the interior surfaces 103 of the respective coil assembly 28 or 30, when it is placed onto the arm 32. The support section 48 helps maintain the coil assembly properly positioned on the magnet housing 18. The attachment section 52 of each arm 32 extends into the coil assembly past the interior surfaces 103 and into a narrow portion 105 (FIG. 4) of the coil assembly. The attachment section 52 assists in maintaining the coil assembly in the proper orientation and also attaches the respective coil assembly to the magnet housing 18. The attachment section 52 includes a centrally located hole 53 (FIG. 2) that extends longitudinally through the height of the attachment section. The hole 53 in the attachment section aligns with a corresponding hole 136 in each coil assembly 28 and 30 when the coil assemblies are placed on the magnet housing 18. The studs 40 extend through the holes 136 in the coil assemblies, through the holes 53 in the attachment sections 52, through the holes 44 in the container 14 and are received in the nuts 42.

The magnet housing 18 includes a wall or separator 66 (FIG. 2) that extends radially outward from the surface of the magnet housing between the pair of arms 32 and between the arms 32 and the arm 34. After assembling the coil assemblies 28 and 30 on the arms 32, the separators 66 are located between the coil assemblies as best seen in FIGS. 1 and 4. The separators 66 ensure that the coil assemblies 28 and 30 are properly spaced outward from the center of the shaft 16.

Both coil assemblies 28 and 30 include a bobbin having an outer plate 100, that is spaced apart and joined to an inner plate 102 by an open rectangular center section defined by walls 103 and narrow portion 105 (FIGS. 2 and 4). The open rectangular sections of the bobbin are sized to fit snugly over the coil support sections 48 and coil attachment sections 52 of arms 32 as best seen in FIG. 4. The portion of the rectangular section located adjacent the magnet housing 18 includes sidewalls 104 that slant outwardly and lie tangential to the cylindrical exterior surface of the bobbin 18 when the coil assemblies are placed on the magnet housing. The slanted walls 104 help to index the coil assemblies as they are placed on the arms 32. Preferably, the slanted walls 104 also allow the coil assemblies 28 and 30 to be placed on the arms 32 such that the coils 78 partially overlap the interior of the cavity 46 and extend inward past the cylindrical surface established by the exterior surface of the permanent magnet 58 as best seen by FIG. 4.

It is beneficial for the coils 78 to be placed as close to or overlapping the exterior cylindrical surface of the permanent magnet 58 as possible in order to increase the efficiency of the coils. Placing the coils in an overlapping relationship with the permanent magnet allows the movement to produce greater torques using the same amount of power supplied to the coils as similar movements having coil assemblies spaced further outward from the permanent magnet 58.

As discussed above, the coils 78 are formed by winding continuous loops of wire around each bobbin between the inner and outer plates 100 and 102. The ends of the wire forming each coil 78 are electrically attached to the electrical pole pieces 70. Each pole piece 70 is held in place in the outer plates 100 by a serrated section 72 that is press fit into holes in the outer 100 plates. The ends of the wire may be electrically attached to the pole pieces 70 through any suitable manner, however, generally, they are attached by soldering in a dipping operation. Preferably, the structure of the coil assemblies 28 and 30 is formed of a material that maintains dimensional tolerances well and allows the coil assemblies to be solder dipped without damage. One material suitable to form the coil assemblies from is Ryton™, however, other materials could also be used.

The assembled drive mechanism 12 is placed within and surrounded by the container or shield pot 14. Preferably, the shield pot 14 is formed of a magnetically susceptible or low coercive force material and surrounds the sides and bottom of the drive mechanism. It is advantageous to encircle at least part of the drive mechanism 12 with a magnetically susceptible material to help prevent exterior magnetic fields from interfering with the operation of the movement. In addition, the shield pot 14 helps to prevent magnetic fields produced by the movement 10 from interfering with other instrumentation in close proximity. Encircling at least part of the coil assemblies 28 and 30 with a ring of a magnetically susceptible material also increases the field strength of the magnetic fields produced by the coils 78, thus increasing efficiency.

To prevent most magnetic fields from interfering with the meter, it is most advantageous if the shield pot 14 is high enough to surround at least the permanent magnet 58. It is also most beneficial that the height of the shield pot is at least as high as the coil assemblies 28 and 30 to achieve the greatest advantages in increasing the field strength of the magnetic fields produced by the coil 78. Although the preferred embodiment illustrates a shield pot including a bottom that surrounds the movement, the shield pot could be reconfigured as discussed above.

In the first embodiment, the drive mechanism 12 includes two coil assemblies 28 and 30 and is configured to be placed within a non-cylindrical shield pot 14. As best seen in FIG. 4, the use of a non-cylindrical shield pot 14 allows a plurality of movements 10 to be nested in an instrument cluster in order to decrease the distance 154 between the centers of the shafts 16. Normally, it is not advantageous to place a drive mechanism off center within a round shield pot or within a non-circular shield pot. However, according to the present invention, the cross-sectional shape of the shield pot 14 has been tailored to allow the drive mechanism 12 to be placed in a non-circular shield pot without causing the permanent magnet 58 to seek a homing position. As shown in FIG. 4, the configuration of the shield pot 14 makes maximum use of the design of the two-coil embodiment of the drive mechanism 12 to produce nested meters.

The shape of the shield pot 14 was empirically determined to reduce or eliminate permanent magnet homing and reduce hysteresis errors. The specific dimensions and shape of the shield pot 14 will differ depending upon the angular orientation of the coil assemblies 28 and 30, the shape and number of windings of the coils 78, the dimensions of the permanent magnet 58, the depth of the coils and magnet etc.

In order to determine the shape of the shield pot 14, the drive mechanism 12 was first configured to the desired specifications and sizes. The flat sides 80 of the shield pot 14 were then sized based upon the dimensions of the drive mechanism. The angle at which the flat sides are oriented and the shape of the curved section 82 were then iteratively determined until the permanent magnet 58 no longer sought a homing position.

In one exemplary embodiment, a permanent magnet 58 formed of ferrite magnetic compound having a diameter of 8 mm, a height of 7 mm and two coil assemblies 28 and 30 whose central access are located 120° from each other were used. The distance between the center of the shaft 16 and the center of each coil assembly was 5 mm. The resulting shield pot 14 used two generally flat sides 80 (FIG. 5) and a generally elliptical portion 82. The flat sides 80 are angularly displaced such that the angle 122 between the central axis 156 of the container and a line normal to the sides 80 and intersecting the shaft 16 is approximately 31°. The perpendicular distance 120 between the center of the shaft and the closest point on each side 80 is 7.5 mm and the length 118 of each side 80 is approximately 10 mm. The shape of the surface 82 is approximately defined as a portion of an ellipse having a major axis 124 of 27.4 mm and a minor axis of 20.8 mm. The dimensions and shape of the shield pot 14 set forth above are for illustrative purposes only and will differ in alternate embodiments.

Figure 6:
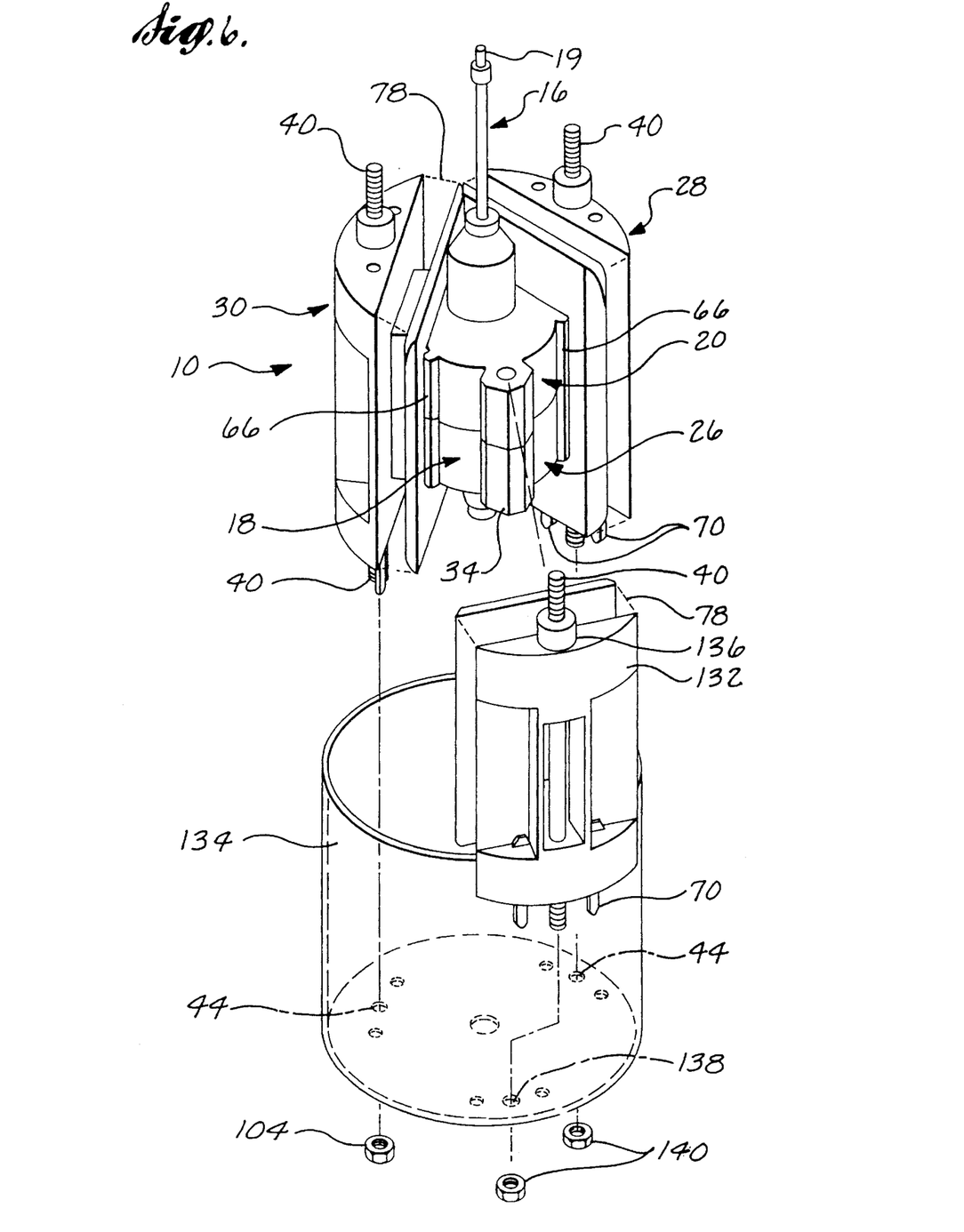
FIG. 6 is a partially exploded view of an alternate embodiment of a movement according to the present invention.
Figure 7:
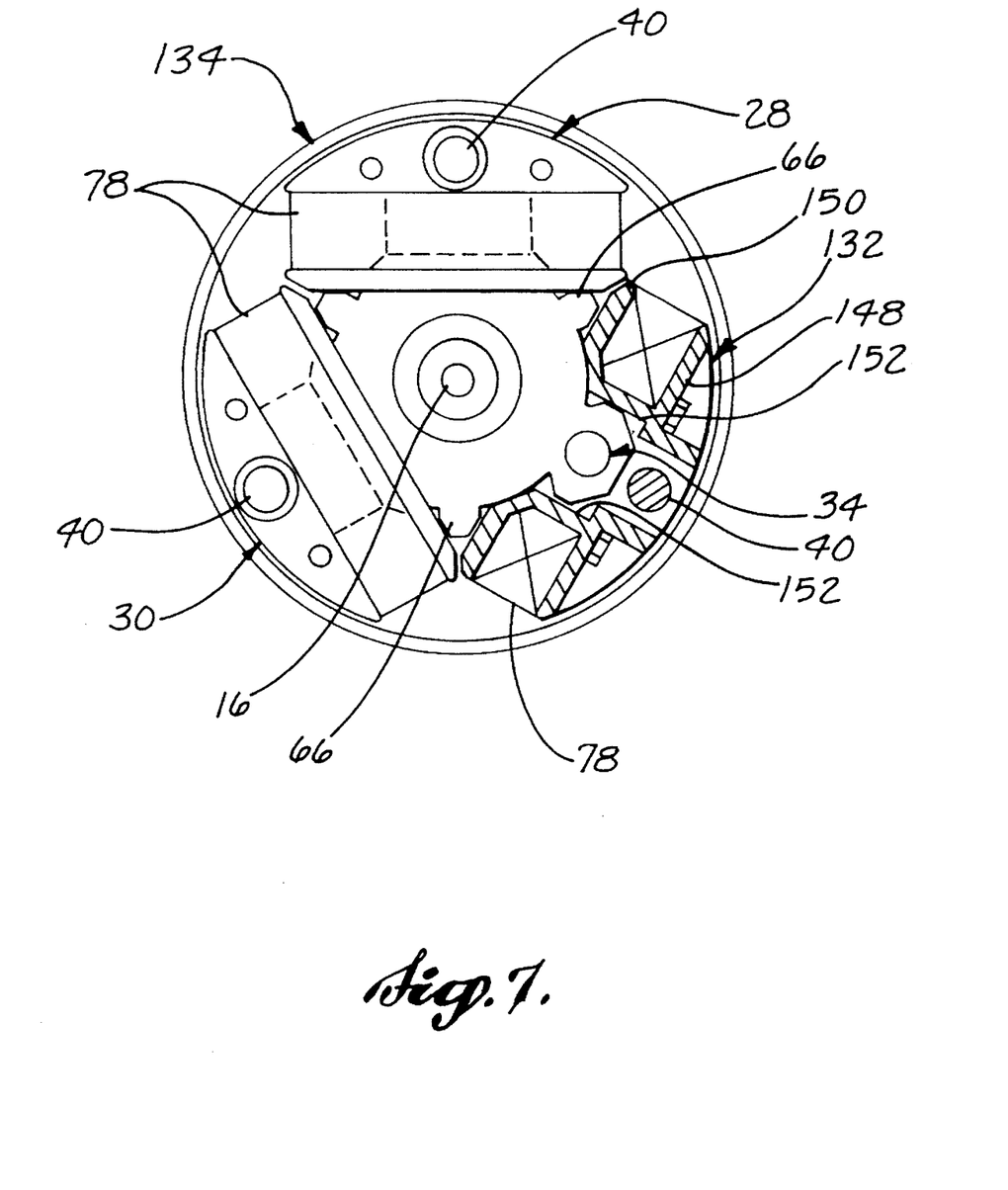
FIG. 7 is a top, partial cut away view of the movement of FIG. 6.

A second embodiment of the invention is illustrated in FIGS. 6 and 7. The features of the second embodiment that function in a similar manner to corresponding features of the first embodiment are identified with the same reference numbers and may be understood by reference to the discussions of the first embodiment. The second embodiment corresponds generally to the first embodiment only it includes a third coil assembly 132 and the drive mechanism 10 is contained within a cylindrical shield pot 134.

The third coil assembly 132 functions in the same manner as the coil assemblies 28 and 30 of the first embodiment and may be understood by reference to the discussion of the first embodiment. In a manner similar to that described with respect to the first embodiment, the third coil 132 assembly is aligned on the magnet housing 18 by the arm 34 that extends into and contacts the surfaces 103 of the coil assembly 132. The arm 34 is shaped the same as the support sections 48 of the arms 32. However, unlike the arms 32, the arm 34 does not include an attachment section 52.

The separators 66 prevent the coil assembly 132 from being inserted too far onto the magnet housing 18 and prevents the edges of coil assembly 132 from contacting the coil assemblies 28 and 30. Because the arm 34 does not include an attachment section 52, the coil assembly 132 is attached to the magnet housing 18 in a different manner than the coil assemblies 28 and 30. The coil assembly 132 is attached to the magnet housing by a stud 40 (FIG. 6) that extends through the hole 136 in the coil assembly 132, through a hole 138 in the cylindrical shield pot 134 and is received in a fastener such as a nut 140. In a manner similar to that described with respect to the first embodiment, the cylindrical container 134 is magnetically susceptible and helps to prevent exterior magnetic fields from interfering with operation of the movement, helps to prevent magnetic fields produced by the movement from interfering with other instrumentation, and increases the field strength of the magnetic fields produced by the coils 78.

The present invention's use of discrete coil assemblies 28, 30 and 132 allows the resistance, size, location, number of loops, etc. of each coil assembly to be carefully matched. In particular, if an automated manufacturing process is used, each coil assembly can be maintained at a constant number of windings and wound at a constant tension. The invention's ability to carefully match the resistance of the coils reduces the problems associated with cross coil movements. In addition, each coil assembly can be manufactured with the same thickness, thus absorbing and radiating heat at approximately the same rate. Therefore, as the drive mechanism is energized, the coils heat and cool more evenly, increasing the accuracy of the meter.

Because the resistance of the coil assemblies are matched, it is also not necessary to balance the coils through the use of external resistors. The matched coils also allow the present invention to be used in combination with less expensive voltage driving circuits as opposed to current driving circuits. Thus, the present invention may be less expensive to utilize than cross coil movements.

Another advantage of the present invention is that it is a modular design that utilizes most of the same parts to produce either a two coil assembly or a three coil assembly movement. In addition, in the invention, the magnet housing is formed from a suitable bearing material while the coil assemblies are formed of a structurally stable, high temperature material capable of being solder dipped. The present invention does not need to compromise on either the bearing surfaces of the magnet housing or the structural rigidity and temperature capabilities of the coil assemblies resulting in a better performing movement.

Using two coil assemblies as opposed to three or more coil assemblies may also reduce manufacturing costs by reducing the number of parts. The use of two coil assemblies 28 and 30 along with a tailored shield pot 14 according to the invention also allows individual meters to be nested into an instrument cluster (FIG. 4) that reduces the overall size of the instrument cluster.

Using three coil assemblies as described in the second embodiment, each oriented at a different angle, also allows at least two coil assemblies at a time to be energized to produce a desired magnetic field orientation. This allows an even magnetic field strength to be produced over an entire 360° of movement of the shaft 16. Energizing more than one coil assembly at one time also reduces the magnitude of the side loads on the permanent magnet, reducing wear and increases the smoothness of the movement.

In alternative embodiments of the invention, the two-coil embodiment of the invention could be placed within a cylindrical shield pot or the coil assemblies in either the two or three coil movements could be located at different angular displacements.

Figure 9A:
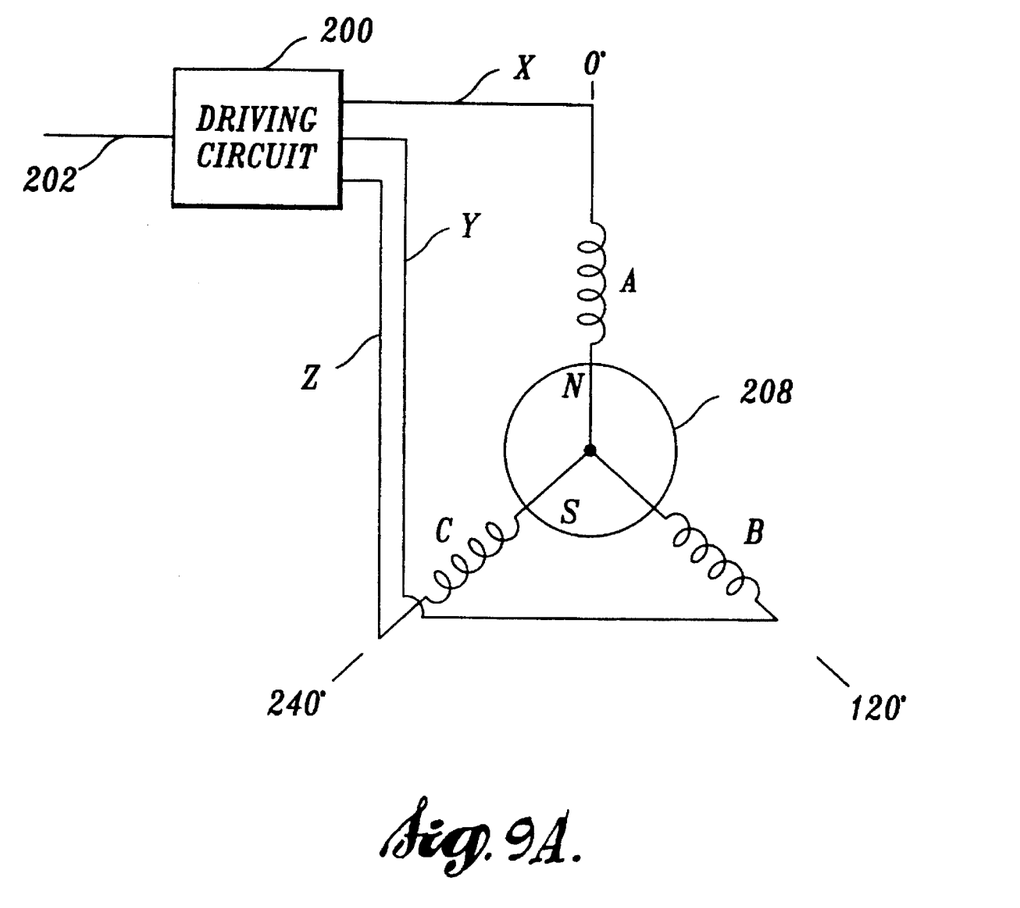
FIG. 9A is a schematic representation of an embodiment of a circuit to drive the analog movement of the present invention.

The coils 78 of both the two and three coil embodiments of the invention may be energized to produce 360° angular displacements of the shaft 16 using many different methods, one of which is described below. In FIG. 9A, the three coil assemblies A, B and C of the second embodiment are shown schematically connected in a "Y" configuration. One end of each coil is connected to each other coil in a "Y" while the other end of each coil is connected to a driving circuit 200. The driving circuit 200 can be an analog or digital computational device capable of receiving an input signal 202 indicative of a quantity to be displayed. Driving circuit 200 then provides three output signals "X," "Y," and "Z" to coils A, B and C, respectively as described below. In the preferred embodiment, the driving circuit includes a microprocessor to perform the required calculations and produce signals X, Y and Z.

Input signal 202 is provided to the driving circuit 200 by external instrumentation (not shown). Input signal 202 contains information on the desired orientation of the pointer from 0° to 360°. The desired orientation requested by the input signal 202 is calibrated with a scale on the meter to indicate a quantity such as miles per gallon, rpm, etc., in a manner well known in the art. Driving circuit 200 receives input signal 202 and calculates the magnitude of the signals X, Y and Z needed to angularly displace the indicator to produce the orientation requested by the input signal 202. Driving circuit 200 could be either a voltage or current driving circuit constructed in a manner well known in the art.

In FIG. 9A, the pointer is assumed to be aligned with the North "N" and South "S" poles of the permanent magnet. Driving circuit 200 calculates the magnitudes of signals X, Y and Z according to the following equations.

$$X = K/2(1+\cos(I)) \quad (1)$$

$$Y = K/2(1+\cos(I-120)) \quad (2)$$

$$Z = K/2(1+\cos(I-240)) = K - (X+Y) \quad (3)$$

"I" is the orientation requested by the input signal in degrees and "K" is the full scale value of the signals X, Y and Z. The equations above are for coils A, B and C oriented at 0°, 120° and 240°, respectively. If coils A, B and C are oriented at other angles, suitable changes may be made to equations 1–3 to drive the coils. As can be easily seen, if I is zero degrees, the resultant of the magnetic fields produced by coils A, B and C will be oriented at zero degrees as shown in FIG. 9A. Similarly, if I is 90°, the resultant of the magnetic fields produced by coils A, B and C will be oriented at 90°.

The permanent magnet and thus indicator rotate until the North and South poles of the permanent magnet are aligned with the North and South poles of the resultant magnetic field produced by coils A, B and C. A three coil "Y" configuration as described above produces sufficient torque to move the pointer through 360° of rotation.

Figure 9B:
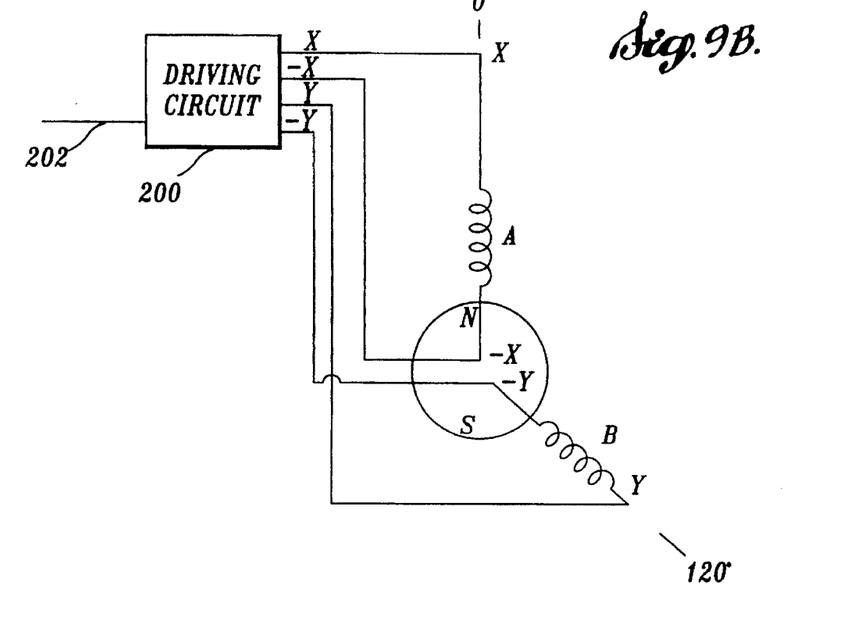
FIG. 9B is a schematic representation of a second embodiment of the circuit to drive the analog movement of the present invention.

In a similar manner to that described above, the two-coil embodiment of the invention may be driven using Equations 1 and 2. In the two-coil embodiment of the invention, the third or "C" coil is eliminated and the first and second coils are connected as shown in FIG. 9B and are driven by driving circuit 200 using outputs X and −X, and Y and −Y. As with the three coil embodiment, the two coil embodiment can move the pointer through 360° of rotation.

Figure 9C:
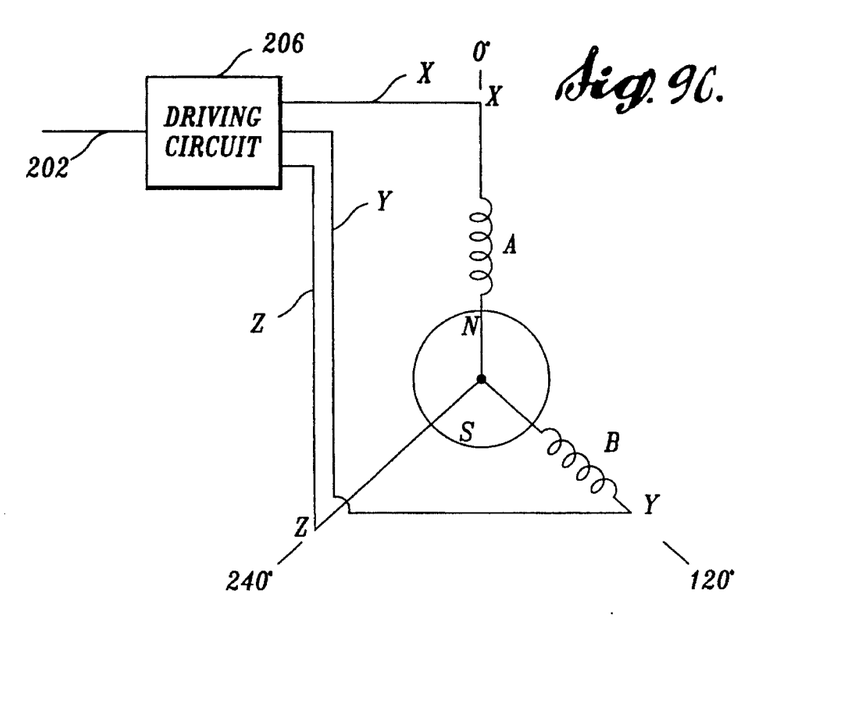
FIG. 9C is a schematic representation of a third embodiment of a circuit to drive the analog movement of the present invention.

The two coil embodiment of the invention may also be driven using equations 1, 2 and 3. In this embodiment the third or "C" coil is eliminated and the first and second coils are connected as shown in FIG. 9C. Signal X is supplied to one end of coil A, signal Y is applied to one end of coil B and signal Z is applied to the opposite end of both coils A and B. As with the three coil embodiment, this two coil embodiment can move the pointer through 360° of rotation.

In addition to driving the coils as discussed above, it may be advantageous for the driving circuit 200 to add a small dither signal to the input signal 202 and thus output signals X and Y in a manner well known in the art. A small dither signal produces a slight shaking of the indicator or shaft during movement. The shaking helps to overcome bearing friction that can cause the shaft to stick or jump during operation. In alternate embodiments of the invention, both the two and three-coil embodiments of the invention could be driven in other manners.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A moving magnet movement for driving an indicator in a meter, the movement comprising:

(a) a housing;

(b) a permanent magnet rotatably coupled to the housing for rotation about an axis of rotation;

(c) first and second coil assemblies positioned and angularly displaced from each other around the axis of rotation of the permanent magnet, each coil assembly including an electrical coil that produces a magnetic flux in response to an electrical signal so as to angularly displace the permanent magnet; and (d) a shield pot having a noncircular cross-sectional shape and being formed of a magnetically susceptible material at least partially surrounding the first and second coils, permanent magnet and housing, the cross-sectional shape of the shield pot allowing the axis of rotation of the permanent magnet to be located such that the noncircular cross section of the shield pot does not create a homing position for the permanent magnet and so that the noncircular cross-sectional shape of the shield pot allows the axis of rotation of the permanent magnets of two individual movements to be placed closer together than similarly sized movements using shield pots having a circular cross-sectional shape and permanent magnets having an axis of rotation located at the central axis of the shield pots.

2. The movement of claim 1, wherein the permanent magnet is rotatably mounted within the housing such that the axis of rotation of the magnet is displaced from a central axis of the interior cross-sectional shape of the shield pot.

3. The movement of claim 2, wherein the cross-sectional shape of the shield pot is shaped to allow the axis of rotation of the magnet to be displaced from the central axis of the shield pot without creating a homing position in the meter.

4. The movement of claim 1, wherein the first and second coil assemblies are formed as separate assemblies and are then joined to the housing.

5. The movement of claim 1, wherein each of the electrical coils surround a portion of the housing and a portion of the permanent magnet.

6. The movement of claim 1, wherein each coil assembly includes a bobbin formed of a first material and wherein the housing is formed of a second material that is different from the first material.

7. The movement of claim 1, wherein the cross-sectional shape of the shield pot includes two approximately flat portions and a curved portion approximately defined by an ellipse.

8. The movement of claim 1, wherein the movement comprises a single permanent magnet having a single north and south pole.

9. A moving magnet movement for driving an indicator in a meter, the movement comprising:

(a) a housing;

(b) a single permanent magnet rotatably coupled to the housing for rotation about an axis of rotation, the permanent magnet having a single north and south pole; and (c) a plurality of coil assemblies positioned and angularly displaced around the axis of rotation of the permanent magnet, each coil assembly including an electrical coil that produces a magnetic flux in response to an electrical signal so as to angularly displace the permanent magnet; and a shield pot having a noncircular cross-sectional shape and being formed of a magnetically susceptible material at least partially surrounding the first and second coils, permanent magnet and housing, the cross-sectional shape of the shield pot being configured to allow the axis of rotation of the permanent magnet to be displaced from a central axis of the cross-sectional shape of the shield pot without the shield pot creating a homing position for the permanent magnet.

10. The movement of claim 9, wherein each coil assembly includes a bobbin formed of a first material and wherein the housing is formed of a second material that is different from the first material.

11. A moving magnet movement for driving an indicator in a meter, the movement comprising:

(a) a housing;

(b) a permanent magnet rotatably coupled to the housing for rotation about an axis of rotation;

(c) a plurality of coil assemblies positioned and angularly displaced around the axis of rotation of the permanent magnet, each coil assembly including a bobbin and an electrical coil that produces a magnetic flux in response to an electrical signal so as to angularly displace the permanent magnet, wherein each bobbin is formed as a separate piece from the housing and includes an open center section that allows the bobbin to be placed over the housing so that each electrical coil surrounds a portion of the housing and a portion of the permanent magnet; and (d) a shield pot formed of a magnetically susceptible material at least partially surrounding the first and second coil assemblies and the housing, wherein the cross-sectional shape of the shield pot is tailored to allow the axis of rotation of the permanent magnet to be located off a central axis of the cross-sectional shape of the shield pot without creating a homing position in the meter.

12. The movement of claim 11, wherein the cross-sectional shape of the shield pot includes two approximately flat portions and a curved portion approximately defined by an ellipse.

13. The movement of claim 11, wherein the bobbin is formed of a first material and wherein the housing is formed of a second material that is different from the first material.

14. The movement of claim 11, wherein the cross-sectional shape of the shield pot is noncircular and allows the axis of rotation of the permanent magnets in two individual movements to be placed closer together than similarly sized movements having round shield pots and permanent magnets having an axis of rotation located on the central axis of the round shield pots.

15. A moving magnet movement for driving an indicator in a meter, the movement comprising:

(a) a housing having an approximately central cavity and a plurality of arms extending radially outward from the central cavity;

(b) a permanent magnet rotatably coupled to the housing and located within the central cavity;

(c) a plurality of coil assemblies, each coil assembly including a bobbin and an electrical coil that is wound about the bobbin, the electrical coil producing a magnetic flux in response to an electrical signal so as to angularly displace the permanent magnet, the bobbin including a centrally located opening sized to allow the bobbin to be placed around one of the arms so that the electrical coil surrounds a portion of the arm and a portion of the permanent magnet; and (d) a shield pot formed of a magnetically susceptible material at least partially surrounding the first and second coils and housing.

16. The movement of claim 15, wherein the cross-sectional shape of the shield pot is noncircular and allows the axis of rotation of the permanent magnet to be displaced from a central axis of the shield pot without the shield pot creating a homing position in the meter.

17. The movement of claim 16, wherein the cross-sectional shape of the shield pot is noncircular and includes two approximately flat portions and a curved portion approximately defined by an ellipse.

18. The movement of claim 15, wherein the bobbin is formed from a first material and the housing is formed from a second material that is different from the first material.

19. The movement of claim 15, wherein the cross-sectional shape of the shield pot allows the axis of rotation of the permanent magnets in two individual movements to be placed closer together than similarly sized movements using round shield pots and permanent magnets having axis of rotation located on the central axis of the round shield pots.

20. The movement of claim 15, wherein each of the bobbins is attached to a respective arm by a shaft that extends through the bobbin and respective arm.

21. The movement of claim 15, wherein the housing is formed of a first material and the bobbin is formed of a second material that is different from the first material.

22. A moving magnet movement for driving an indicator in a meter, the movement comprising:

(a) a housing;

(b) a permanent magnet rotatably coupled to the housing for rotation about an axis of rotation;

(c) first and second coil assemblies positioned around the axis of rotation of the permanent magnet, each coil assembly including an electrical coil that produces a magnetic flux in response to an electrical signal so as to angularly displace the permanent magnet; and (d) a shield pot formed of a magnetically susceptible material at least partially surrounding the first and second coils and housing, the cross-sectional shape of the interior surface of the shield pot including two approximately flat portions and a curve portion approximately defined by an ellipse.

* * * * *